(12) United States Patent
Yoneda et al.

(10) Patent No.: US 6,850,005 B2
(45) Date of Patent: Feb. 1, 2005

(54) ELECTROLUMINESCENCE DISPLAY APPARATUS WITH OPENING IN SILICON OXIDE LAYER

(75) Inventors: Kiyoshi Yoneda, Mizuho (JP); Ryuji Nishikawa, Gifu (JP); Koji Suzuki, Aichi (JP); Shinji Ichikawa, Hashima (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/627,179

(22) Filed: Jul. 24, 2003

(65) Prior Publication Data

US 2004/0066136 A1 Apr. 8, 2004

(30) Foreign Application Priority Data

Jul. 25, 2002 (JP) ........................................ 2002-216666

(51) Int. Cl.[7] .............................. H01J 1/62; H01J 63/04
(52) U.S. Cl. ........................ 313/506; 313/498; 313/499; 257/40; 257/59; 257/72; 345/76; 345/92
(58) Field of Search ................................. 313/498, 499, 313/500, 506; 257/59, 40, 72, 79; 345/76, 80, 92

(56) References Cited

U.S. PATENT DOCUMENTS

| | | | |
|---|---|---|---|
| 5,404,074 A | 4/1995 | Watanabe et al. ........... 313/495 |
| 5,606,225 A | 2/1997 | Levine et al. ............ 315/169.3 |
| 5,757,139 A | 5/1998 | Forrest et al. ........... 315/169.3 |
| 6,144,144 A | 11/2000 | Cleeves et al. ............. 313/309 |
| 6,277,679 B1 * | 8/2001 | Ohtani ....................... 438/151 |
| 6,281,552 B1 * | 8/2001 | Kawasaki et al. .......... 257/350 |
| 6,365,917 B1 * | 4/2002 | Yamazaki .................... 257/72 |
| 6,420,758 B1 * | 7/2002 | Nakajima ................... 257/350 |
| 6,492,778 B1 | 12/2002 | Segawa .................... 315/169.3 |
| 6,512,504 B1 * | 1/2003 | Yamauchi et al. ............ 345/87 |
| 6,522,079 B1 | 2/2003 | Yamada .................... 315/169.3 |
| 6,531,815 B1 | 3/2003 | Okuyama et al. ........... 313/506 |
| 2003/0057862 A1 | 3/2003 | Segawa .................... 315/169.3 |

* cited by examiner

*Primary Examiner*—Joseph Williams
*Assistant Examiner*—Kevin Quarterman
(74) *Attorney, Agent, or Firm*—Cantor Colburn LLP

(57) ABSTRACT

An inter-layer insulating film and a gate insulating film which are positioned on the optical path of light from an organic EL element to be externally emitted, for example, located under a transparent electrode, are removed. Because $SiO_2$ films having a refractive index which differs significantly from refractive indexes of other films are used for these films, there was a problem of light attenuation in these layers. Such light attenuation can be reduced by removing these layers located in the region through which light from the organic EL element passes.

15 Claims, 2 Drawing Sheets

ELECTROLUMINESCENCE DISPLAY APPARATUS WITH OPENING IN SILICON OXIDE LAYER

BACKGROUND OF THE INVENTION

1. Field of the Invention

The present invention relates to an organic electrolulminescence (EL) element, and more particularly to prevention of attenuation of light to be externally emitted.

2. Description of Related Art

Organic EL display panels (organic EL display apparatuses) have conventionally been known as one example of flat display panels. Because, unlike liquid crystal display (LCD) panels, organic EL display apparatuses are self emissive and because organic EL display apparatuses are bright and clear flat display panels, their widespread use is very much expected.

An organic EL display apparatus comprises a large number of organic EL elements arranged in a matrix, and employs these organic EL elements as pixels of a display. Such organic EL elements can be driven passively or actively, similar to LCDs, and, as is also the case with LCDS, active matrix displays are more preferable. More specifically, in active matrix displays, switching elements (typically two elements including a switching element and a driving element) are provided for each pixel and display of each pixel is controlled by controlling the switching elements, whereas in passive driving, a switching element is not provided for each pixel. Of these two types of displays, the active matrix is more preferable because much more precise displays can be achieved.

In such active matrix organic EL display apparatuses, it is necessary to provide, for each pixel, two switching elements, a capacitor, and an EL element, which are located at different positions on a plane. Typically, thin film transistors (TFTs) serving as switching elements and a capacitor are formed on a glass substrate, and an organic EL element formed by lamination of an anode such as ITO, a hole transport layer, an organic emissive layer, an electron transport layer, and a cathode is provided above the TETs and the capacitor.

When the TFT is driven to cause current to flow in the organic EL element, light produced in the emissive layer is emitted through the anode and the glass substrate. This is called bottom emission type, because light is emitted from the glass substrate.

As described above, the organic EL element is formed, after formation of the TFTs, above the TFTs. In this case, for the purpose of insulation between the TFTs and the organic EL element and because it is desired that the surface on which the organic EL element is formed be as flat as possible, a gate insulating film located between the gate electrode and the channel electrode of the TFT and an inter-layer insulating film covering the gate electrode are formed so as to cover the entire surface of the substrate. Then, a planarization film is formed to cover these layers and planarize the entire surface, and the anode is provided thereon.

Consequently, the planarization film, the inter-layer insulating film, the gate insulating film, or the like are provided between the anode of the organic EL element and the substrate located below. The planarization film is formed of an organic material such as an acrylic resin, and the inter-layer insulating film and the gate insulating film are formed of silicon oxide, silicon nitride, and so on. Thus, a laminated structure made up of layers of various materials is provided under the organic EL element.

Here, light emission is not reduced when the refractive indexes of these layers of various materials are substantially the same. However, when there is a significant difference in the refractive indexes between adjacent layers among these layers, significant reflection is caused at the interface of these layers. Consequently, in a structure in which light from the organic EL element is externally emitted through the substrate, there is a problem that the amount of light from the EL element to be transmitted decreases, and this results in reduction in the emission efficiency (external emission efficiency), which defines actually emitted light.

SUMMARY OF THE INVENTION

According to the present invention, it is possible to provide an organic EL display apparatus with improved element reliability in which light attenuation is reduced in the course of light emission.

In accordance with one aspect of the present invention, there is provided an electroluminescence display apparatus comprising a plurality of pixels provided over a common substrate, each pixel comprising, an electroluminescence element including a transparent lower electrode, an emissive element layer including an emissive material, and an upper electrode formed to face the lower electrode via the emissive element layer, and a thin film transistor for controlling light emission of the electroluminescence element, the thin film transistor being formed below the electroluminescence element and is electrically connected with the electroluminescence element, wherein the thin film transistor includes a gate electrode, a silicon oxide layer, and a silicon active layer, the lower electrode of the electroluminescence element which is connected to the thin film transistor extends in a region where the thin film transistor is not formed, and in the region where the thin film transistor is not formed, the silicon oxide layer has an opening, and a moisture blocking insulating film, which is formed to cover the thin film transistor in a region where the thin film transistor is formed and which is formed over the substrate where the silicon oxide layer is removed in the region where the thin film transistor is not formed, and a planarization insulating film which is formed on the moisture blocking insulating film, are provided between the lower electrode and the substrate.

In accordance with another aspect of the present invention, in the above electroluminescence display apparatus, the moisture blocking insulating film includes silicon nitride.

In accordance with still another aspect of the present invention, in the above electroluminescence display apparatus, an inter-layer insulating film including a silicon oxide layer is formed between the thin film transistor and the moisture blocking insulating film which covers the thin film transistor, a gate insulating film including a silicon oxide layer is formed between the silicon active layer and the gate electrode of the thin film transistor, and both the silicon oxide layer of the inter-layer insulating film and the silicon oxide layer of the gate insulating film have an opening in the region where the thin film transistor is not formed.

In accordance with a further aspect of the present invention, in the above electroluminescence display apparatus, a buffer layer is formed between the substrate and the thin film transistor for preventing impurities from the substrate from entering the thin film transistor, and the buffer layer includes a silicon oxide layer, the silicon oxide layer having an opening in the region where the thin film transistor is not formed.

In accordance with another aspect of the present invention, in the above electroluminescence display apparatus, the lower electrode of the electroluminescence element is formed of transparent conductive metal oxide, the moisture blocking insulating film is either one of silicon nitride and tetraethoxysilane, and the planarization insulating film is either one of resin, silicon nitride, and tetraethoxysilane.

As described above, according to the present invention, the silicon oxide layer has an opening and therefore does not exist in a region located under the electroluminescence element, particularly in the region below the emissive region of the electroluminescence element. Consequently, it is possible to reduce the possibility that light emitted from the electroluminescence element and advancing toward the substrate will be reflected due to a difference of refractive indexes of the layers, so that the light emission efficiency (external light emission efficiency) of the display apparatus can be increased. On the other hand, the moisture blocking film and the planarization film are provided between the lower electrode of the electroluminescence element and the substrate. It is therefore possible to reliably prevent intrusion of moisture from the substrate side into the emissive element layer which comprises an organic material or the like and is likely to deteriorate when exposed to moisture. Further, due to the provision of the planarization film, the emissive element layer can be formed on a planar surface, so that short circuit or the like of the thin emissive element layer can reliably be prevented.

In accordance with another aspect of the present invention, there is provided an electroluminescence display apparatus comprising a thin film transistor including a silicon oxide layer, the thin film transistor being formed over a transparent substrate, and an electroluminescence element formed on an insulating film which is formed so as to cover the thin film transistor, wherein the electroluminescence element includes a transparent electrode which is connected with the thin film transistor, which is formed on the insulating film provided over the thin film transistor, and which extends toward the lateral region from a region where the thin film transistor is formed; an emissive element layer including an emissive material, the emissive element layer being formed on the transparent electrode; and an opposing electrode formed on the emissive element layer, the silicon oxide layer of the thin film transistor having an opening at a position under an emissive region of the electroluminescence element, and a light absorption member being provided under the peripheral portion of the emissive region of the electroluminescence element.

As described above, by enclosing the periphery of the emissive region with the light absorption member, it is possible to prevent reflection of light from the substrate side, namely external light when a viewing surface is provided on the substrate side, in the non-light emissive region of each pixel. It is also possible to prevent entering of light which has leaked from another emissive region (the emissive region of another element), thereby increasing display contrast.

In accordance with still another aspect of the present invention, there is provided an electroluminescence display apparatus, comprising a top gate type thin film transistor in which a gate electrode layer is located above a silicon active layer, the thin film transistor being formed over a transparent substrate; and an electroluminescence element formed over an insulating film which is formed so as to cover the thin film transistor, wherein the electroluminescence element includes a transparent electrode which is connected with the thin film transistor, which is formed on the insulating film provided over the thin film transistor, and which extends toward the lateral region from a region where the thin film transistor is formed; an emissive element layer including an emissive material, the emissive element layer being formed on the transparent electrode; and an opposing electrode formed on the emissive element layer, and the thin film transistor includes a silicon oxide layer which has an opening at a position under an emissive region of the electroluminescence element.

In accordance with a further aspect of the present invention, in the above electroluminescence display apparatus, the silicon oxide layer is removed from an optical path along which light obtained in the emissive element layer transmits through the lower electrode to the substrate, such that no silicon oxide layer exists in the optical path.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENTS

Preferred embodiments of the present invention will be described in further detail with reference to the accompanying drawings.

Figure 1:
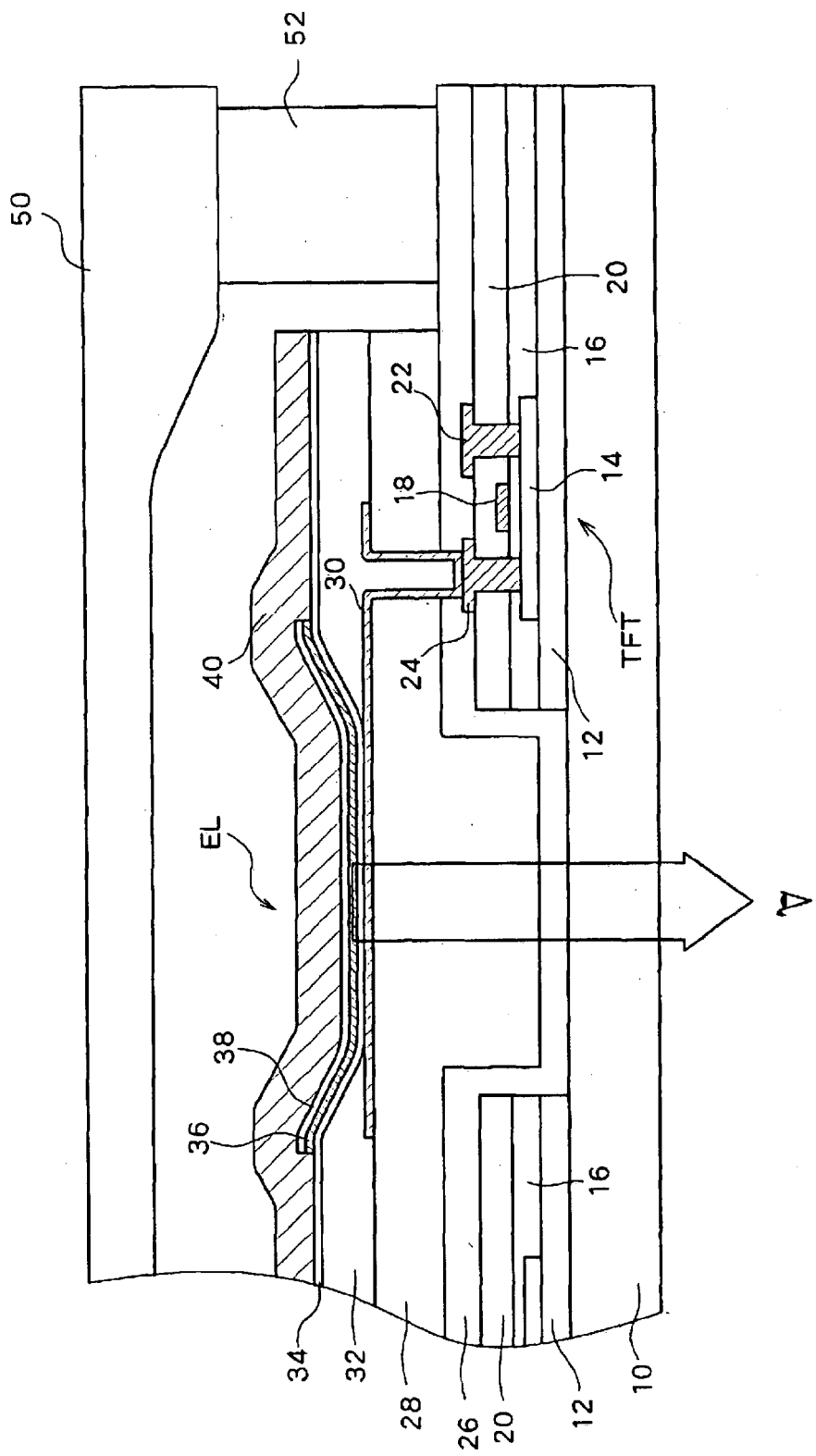
FIG. 1 is a cross sectional view schematically showing a structure of an electroluminescence display apparatus in accordance with one embodiment of the present invention.

FIG. 1 is a cross sectional view showing a main portion (part of a pixel) of one preferred embodiment of the present invention. On a glass substrate 10, an insulating film 12 formed of two layers, an SiNx layer and an $SiO_2$ layer, which are stacked in this order from the substrate side, is provided so as to prevent impurities from the glass substrate 10 from entering. On predetermined portions of the insulating film 12, a large number of thin film transistors are formed. Although in FIG. 1 a second TFT which is a thin film transistor for controlling current flowing from a power source line to the organic EL element is shown, a first TFT is also provided for each pixel for controlling accumulation of voltages (data signals) supplied from the data line in a storage capacitor. The second TFT is switched on in accordance with the voltage accumulated in the storage capacitor for controlling current flowing from the power source line to the organic EL element.

More specifically, on the insulating film 12, a semiconductor layer 14 which is formed of poly-Si and constitutes an active layer of the TFT, is formed. Then, a gate insulating film 16 formed of two layers, an $SiO_2$ layer and an SiNx layer, which are stacked in this order, is formed so as to cover the semiconductor layer 14. A gate electrode 18 formed of Mo or the like is provided via the gate insulating film 16 above the semiconductor layer 14 so as to cover a portion of the semiconductor layer 14. An inter-layer insulating film 20 formed of two layers, an SiNx layer and an $SiO_2$ layer, which are stacked in that order, is further formed so as to cover the semiconductor layer 14, the gate insulating film 16, and the gate electrode 18. Further, towards ends on the semiconductor layer 14, a drain electrode 22 and a source electrode 24 made of aluminum, for example, are formed by forming a contact hole through the inter-layer insulating film 20 and the gate insulating film 16.

A moisture blocking film 26 is further formed over the entire surface so as to cover the drain electrode 22 and the source electrode 24. On the moisture blocking film 26, a first planarization film 28 formed of an organic material such as an acrylic resin is formed. Then, on the first planarization film 28, a transparent electrode 30 such as ITO is formed for each pixel as an anode of the organic EL element.

A part of the transparent electrode 30 extends down on the source electrode 24, where the transparent electrode 30 is formed along the inner surface of a contact hole through which the top surface of the source electrode 24 is exposed. In this manner, the source electrode 24 is directly connected with the transparent electrode 30.

Edge portions of the transparent electrode 30 are covered with a second planarization film 32 formed of an organic insulating material, such as a resin, which is similar to that used for the first planarization film 28. Thus, short-circuit between the edge portions of the anode 30 and the cathode to be formed with the organic layers interposed therebetween is prevented. Further, in the organic EL element, a portion in which the anode and the cathode directly face each other via the organic layers corresponds to the emissive region. Therefore, a portion of the organic EL element formed in the peripheral region of the pixel area, which corresponds to an area outside the emissive region of one pixel, serves as a non-emissive region due to the existence of the second planarization film 32.

A hole transport layer 34 is then formed over the entire surface of the second planarization film 32 and the transparent electrode 30. With such a configuration, because the second planarization film 32 has an opening in the emissive region, the hole transport layer 34 is in direct contact with the transparent electrode 30, which serves as the anode, in the emissive region. On the hole transport layer 34, an emissive layer 36 and an electron transport layer 38 which are slightly larger than the emissive region are sequentially stacked in this order for each pixel. On these layers, a cathode 40 made of aluminum or the like is formed. It is preferable that the cathode 40 is formed of lithium fluoride (LiF) and aluminum (Al) which are sequentially formed in this order. In the present embodiment, the hole transport layer 34, the emissive layer 36 and the electron transport layer 38 are formed between the anode 30 and the cathode 40, and these layers construct an emissive layer, of the organic EL element, having at least one organic compound layer.

With the above structure, when the second TFT is turned on, current is supplied via the source electrode 24 to the transparent electrode 30 of the organic EL element, and flows between the transparent electrode 30 and the cathode 40. In accordance with the current, the organic EL element emits light.

In the present embodiment, the insulating film 12, the gate insulating film 16, the inter-layer insulating film 20, and the moisture blocking film 26 are formed so as reach the periphery on the glass substrate 10, whereas the first planarization film 28, the second planarization film 32, the hole transport layer 34, and the cathode 40 terminate before reaching the periphery. Accordingly, as shown in FIG. 1, a sealing member 52 used for connecting a sealing glass 50 with the glass substrate 10 is bonded to the moisture blocking film 26 on the glass substrate 10.

The sealing member 52, for which a UV cured resin such as an epoxy resin is used, is directly adhered to the moisture blocking film 26. The moisture blocking film 26 is formed of a silicon type nitride layer such as SiNx and TEOS (tetraethoxysilane), and prohibits transport of moisture into the inner layers. It is therefore possible to effectively prevent moisture from entering the space inside the sealing glass 50.

According to the conventional structure, the first and second planarization films 28, 32 are formed on the glass substrate 10 so as to extend to the region under the sealing member 52. The first and second planarization films 28, 32 are formed of an organic material such as an acrylic resin, which has higher moisture absorption property than SiNx or the like, and it is therefore likely that moisture will be introduced into the panel. According to the present invention, on the other hand, the thin film transistor (TFT) provided in the interior of the panel is covered with a silicon type nitride film such as SiNx and TEOS having high moisture resistance, and the space in which the organic EL element is provided is basically enclosed by the moisture blocking film 26, the sealing member 52, and the sealing glass 50, thereby effectively preventing moisture from entering the organic EL element. In particular, this configuration effectively prevents degradation of the organic layers by moisture which results in emission deficiency. It is particularly preferable that SiNx is used for the moisture blocking film 26. The moisture blocking film 26 also has an advantage of preventing disparsing of impurities from the glass.

In the present embodiment, the insulating film 12, the gate insulating film 16, and the inter-layer insulating film 20, which comprise a silicon oxide layer and which are conventionally formed to cover the entire surface of the substrate, are formed only over the region where the TFT is formed, and are not provided at least on the portion under the emissive portion of the organic EL element, namely the emissive region of each pixel, thereby forming an opening at this region. In other words, films other than the first planarization film 28 and the moisture blocking film 26 are not provided between the portion of the transparent electrode 30 of the organic EL element corresponding to the emissive portion and the glass substrate 10.

While the moisture blocking film 26 is provided in a region under the transparent electrode 30 in the above example, it is also possible to remove the moisture blocking film 26 as well and provide only the first planarization film 28 under the transparent electrode 30.

When manufacturing such an organic EL display apparatus, after formation of the TFT on the glass substrate 10, a portion of each of the layers thus formed which corresponds to the region to be located under the emissive portion is removed by etching to expose the glass substrate 10. In this case, dry etching can be used, in which the respective layers can be removed at one time. Then, the moisture blocking film 26 and the first planarization film 28 are sequentially formed.

The first planarization film 28 formed of an acrylic resin and the moisture blocking (silicon nitride) film have refractive indexes of approximately 1.7 and 1.9, respectively, which are significantly close to the refractive index of approximately 1.9 of a conductive metal oxide such as ITO (Indium Tin Oxide) forming the transparent electrode 30. Accordingly, the possibility of light reflection at the interface of these films is low. Conventionally, because silicon oxide $SiO_2$, which forms a portion of the inter-layer insulating film 20, the gate insulating film 16 and the buffer layer 12, has a refractive index of approximately 1.5, light is reflected at the interface of these films due to the presence of this SiO$_2$ film, thereby decreasing the amount of light transmission. According to the present embodiment, by removing the inter-layer insulating film 20, the gate insulating film 16, and the buffer layer 12 which have this SiO$_2$ film, such that no SiO$_2$ films exist in the optical path of emissive light between the emissive element layer and the substrate, sufficiently high amount of light transmission can be achieved. It should be noted that the glass substrate 10 preferably has a relatively high refractive index of approximately 1.6 to 1.9.

Figure 2:
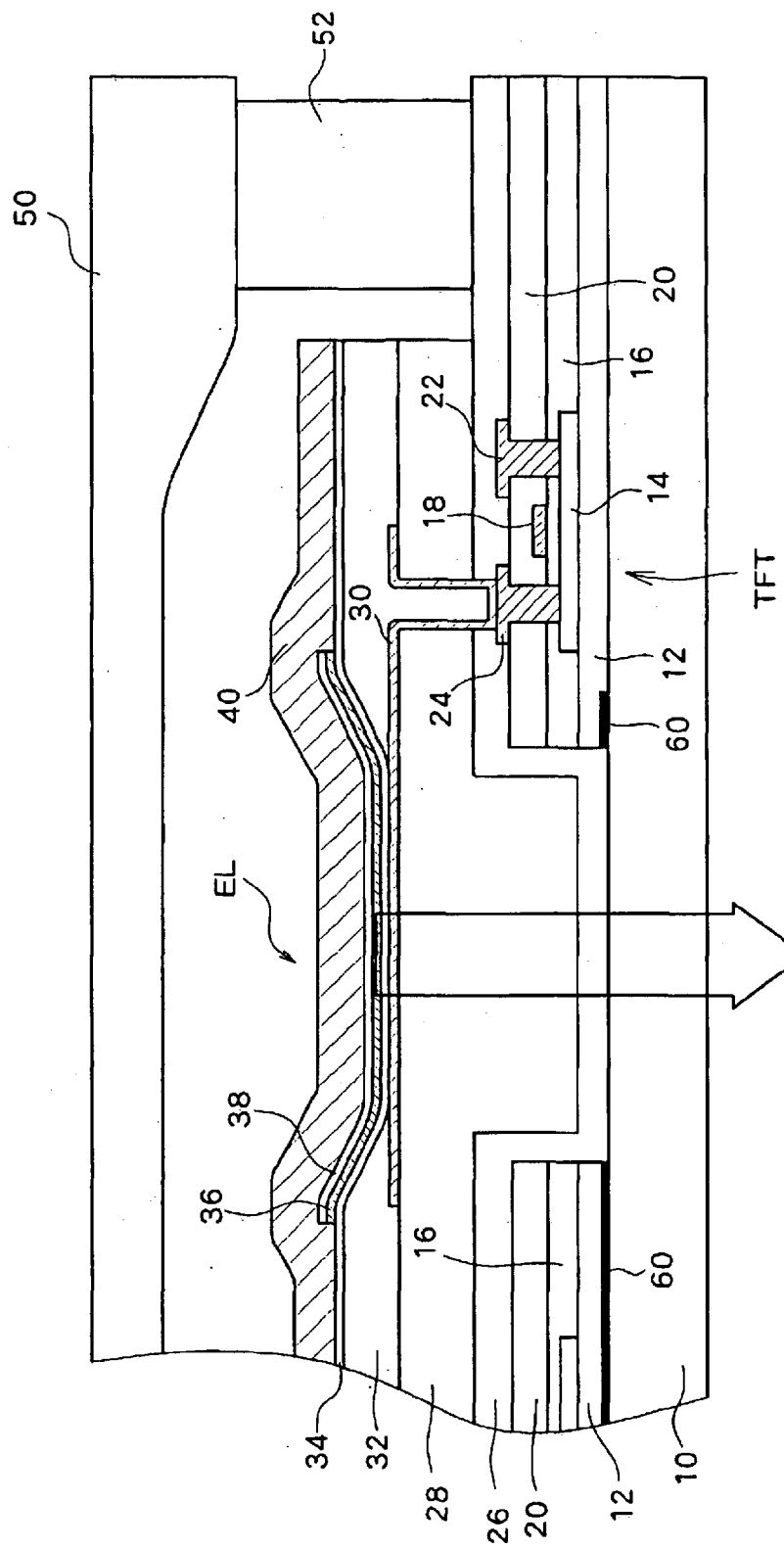
FIG. 2 is a cross sectional view schematically showing a structure of an electroluminescence display apparatus in accordance with another embodiment of the present invention.

FIG. 2 shows another embodiment of the present invention. In this embodiment, a light absorption member, namely an antireflection film 60, is provided on the glass substrate 10. The antireflection film 60 has a two-layered structure made up of chromium oxide (CrOx) and chromium (Cr), which are stacked in this order from the substrate side, and absorbs light entering from under the glass substrate 10 (namely, external light). The antireflection film 60, when formed in the periphery of the emissive portion (namely, in the non-emissive region) of the organic EL element, prevents reflection of external light at this portion and serves as a black matrix. Thus, display contrast can be increased. Further, with the antireflection film 60, it is also possible to prevent entering of light which has leaked from the adjacent pixel, thereby preventing color mixing.

Alternatively, it is also preferable that the antireflection film 60 also be formed in a region located under the emissive portion (emission region) and used as an etching stopper when selectively removing the inter-layer insulating film 20, the gate insulating film 16, and the buffer layer 12 from the emissive region using dry etching. This allows completion of dry etching without adversely affecting the glass substrate 10. Further, an unnecessary portion of the antireflection film 60 which is exposed in the emissive region can be removed by wet etching.

In the above example, the first planarization film 28 and the second planarization film 32 are formed of an organic material such as an acrylic resin. However, an organic material has a high moisture absorption property and already contains a certain degree of moisture when manufactured. An organic material also tends to absorb external moisture when the apparatus is used. As a result, the moisture contained in the organic film may adversely affect the organic emissive material.

Accordingly, it is preferable that an insulating film formed of an inorganic material be used in place of the first planarization film 28 and the second planarization film 32. Silicon nitride (SiNx), TEOS, or the like is preferable as such an inorganic material. Although sufficient planarization as can be achieved with an organic material cannot be obtained when using these inorganic materials, as long as the inorganic material has low moisture absorption property and high surface smoothing property, the problem of emission life or the like can be improved in an organic EL element, even when the electrodes are not flat. It is therefore preferable to use an insulating film made of an inorganic material in place of the first and second planarization films 28, 32.

In this case, it is preferable that both the drain electrode 22 and the source electrode 24 have a three-layered structure comprising Mo/Al/Mo formed by sandwiching an aluminum layer with molybdenum layers. A molybdenum layer, when formed on an inorganic film, tends to have tapered ends. Consequently, the drain electrode 22 and the source electrode 24 will have peripheral ends having a slightly tapered surface and not a vertical surface. This allows sufficient covering of the ends even with an inorganic film.

Further, the transparent electrode 30 formed of ITO is to be positioned over the inorganic film. Because ITO is likely to have tapered ends when formed on an inorganic film, the ends of transparent electrode 30 can also be sufficiently covered by the inorganic film provided in place of the second planarization film.

While, in the foregoing examples, only the bottom emission type in which light is emitted through the glass substrate 10 has been described, the present invention may also be applicable to the top emission type in which light is emitted from the opposite side of the glass substrate 10, by forming a reflection layer (typically formed of metal) outside or inside the glass substrate and forming the cathode as a transparent electrode.

As described above, in accordance with the embodiments of the present invention, no silicon oxide layer is provided in a region located under the emissive region of the organic emissive element, namely on the optical path of light to be externally emitted from the emissive layer. This reduces the possibility that light from the organic emissive element will be reflected due to the difference in refractive indexes, thereby increasing the light emission efficiency of the display apparatus.

Further, by enclosing the emissive portion with a light absorbing material, a structure corresponding to a structure in which a black matrix is disposed is obtained, so that the display contrast can be increased.

While the preferred embodiments of the present invention have been described using specific terms, such description is for illustrative purposes only, and it is to be understood that changes and variations may be made without departing from the spirit or scope of the appended claims.

What is claimed is:

1. An electroluminescence display apparatus comprising a plurality of pixels provided over a common substrate, each pixel comprising:

an electroluminescence element including a transparent lower electrode, an emissive element layer including an emissive material, and an upper electrode formed to face the lower electrode via the emissive element layer; and a thin film transistor for controlling light emission of the electroluminescence element, the thin film transistor being formed below the electroluminescence element and electrically connected with the electroluminescence element, wherein the thin film transistor includes a gate electrode, a silicon oxide layer, and a silicon active layer, the lower electrode of the electroluminescence element which is connected to the thin film transistor extends in a region where the thin film transistor is not formed, and in the region where the thin film transistor is not formed, the silicon oxide layer has an opening, and a moisture blocking insulating film, which is formed to cover the thin film transistor in a region where the thin film transistor is formed and which is formed over the substrate where the silicon oxide layer is removed in the region where the thin film transistor is not formed, and a planarization insulating film which is formed on the moisture blocking insulating film, are provided between the lower electrode and the substrate.

2. An electroluminescence display apparatus according to claim 1, wherein the moisture blocking insulating film includes silicon nitride.

3. An electroluminescence display apparatus according to claim 1, wherein an inter-layer insulating film including a silicon oxide layer is formed between the thin film transistor and the moisture blocking insulating film which covers the thin film transistor, a gate insulating film including a silicon oxide layer is formed between the silicon active layer and the gate electrode of the thin film transistor, and both the silicon oxide layer of the inter-layer insulating film and the silicon oxide layer of the gate insulating film have an opening in the region where the thin film transistor is not formed.

4. An electroluminescence display apparatus according to claim 3, wherein a buffer layer is formed between the substrate and the thin film transistor for preventing impurities from the substrate from entering the thin film transistor, and the buffer layer includes a silicon oxide layer, the silicon oxide layer having an opening in the region where the thin film transistor is not formed.

5. An electroluminescence display apparatus according to claim 1, wherein the lower electrode of the electroluminescence element is formed of transparent conductive metal oxide, the moisture blocking insulating film is either one of silicon nitride and tetraethoxysilane, and the planarization insulating film is either one of resin, silicon nitride, and tetraethoxysilane.

6. An electroluminescence display apparatus according to claim 1, wherein the region where the silicon oxide layers have an opening corresponds to an emissive region of the electroluminescence element.

7. An electroluminescence display apparatus according to claim 1, wherein a light absorption member is disposed under the peripheral portion of the emissive region of the electroluminescence element.

8. An electroluminescence display apparatus according to claim 1, wherein the thin film transistor is a top gate type thin film transistor in which a gate electrode layer is located above a silicon active layer.

9. An electroluminescence display apparatus comprising:

a thin film transistor including a silicon oxide layer, the thin film transistor being formed over a transparent substrate, and an electroluminescence element formed on an insulating film which is formed so as to cover the thin film transistor, wherein the electroluminescence element includes:

a transparent electrode which is connected with the thin film transistor, which is formed on the insulating film provided over the thin film transistor, and which extends toward the lateral region from a region where the thin film transistor is formed;

an emissive element layer including an emissive material, the emissive element layer being formed on the transparent electrode; and an opposing electrode formed on the emissive element layer, the silicon oxide layer of the thin film transistor has an opening at a position under an emissive region of the electroluminescence element, and a light absorption member is provided under the peripheral portion of the emissive region of the electroluminescence element.

10. An electroluminescence display apparatus, comprising:

a top gate type thin film transistor in which a gate electrode layer is located above a silicon active layer, the thin film transistor being formed over a transparent substrate; and an electroluminescence element formed over an insulating film which is formed so as to cover the thin film transistor, wherein the electroluminescence element includes:

a transparent electrode which is connected with the thin film transistor, which is formed on the insulating film provided over the thin film transistor, and which extends toward the lateral region from a region where the thin film transistor is formed;

an emissive element layer including an emissive material, the emissive element layer being formed on the transparent electrode; and an opposing electrode formed on the emissive element layer, and the thin film transistor includes a silicon oxide layer which has an opening at a position under an emissive region of the electroluminescence element.

11. An electroluminescence display apparatus according to claim 10, wherein a light absorption member is provided in the peripheral portion of the emissive region of the electroluminescence element and under the transparent electrode through which light emitted from the emissive element layer transmits.

12. An electroluminescence display apparatus according to claim 10, wherein the silicon oxide layer is removed from an optical path along which light obtained in the emissive element layer transmits through the lower electrode to the substrate, such that no silicon oxide layer exists in the optical path.

13. An electroluminescence display apparatus according to claim 10, wherein an inter-layer insulating film including a silicon oxide layer is formed between the thin film transistor and the moisture blocking insulating film which covers the thin film transistor, a gate insulating film including a silicon oxide layer is formed between the silicon active layer and the gate electrode of the thin film transistor, and both the silicon oxide layer of the inter-layer insulating film and the silicon oxide layer of the gate insulating film have an opening in the region where the thin film transistor is not formed.

14. An electroluminescence display apparatus according to claim 13, wherein a buffer layer is formed between the substrate and the thin film transistor for preventing impurities from the substrate from entering the thin film transistor, and the buffer layer includes a silicon oxide layer, the silicon oxide layer having an opening in the region where the thin film transistor is not formed.

15. An electroluminescence display apparatus according to claim 10, wherein the lower electrode of the electroluminescence element is formed of transparent conductive metal oxide, the moisture blocking insulating film is either one of silicon nitride and tetraethoxysilane, and the planarization insulating film is either one of resin, silicon nitride, and tetraethoxysilane.

* * * * *